(12) United States Patent
Talwar et al.

(10) Patent No.: US 7,145,104 B2
(45) Date of Patent: Dec. 5, 2006

(54) SILICON LAYER FOR UNIFORMIZING TEMPERATURE DURING PHOTO-ANNEALING

(75) Inventors: Somit Talwar, Los Gatos, CA (US); Michael O. Thompson, Ithaca, NY (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 10/787,688

(22) Filed: Feb. 26, 2004

(65) Prior Publication Data

US 2005/0189340 A1 Sep. 1, 2005

(51) Int. Cl.
*F27B 5/14* (2006.01)
*H01L 21/324* (2006.01)

(52) U.S. Cl. .............. 219/390; 219/405; 219/411; 118/725

(58) Field of Classification Search .......... 219/390, 219/405, 411; 392/416; 118/418, 724, 725, 118/50.1
See application file for complete search history.

(56) References Cited

U.S. PATENT DOCUMENTS

| | | | |
|---|---|---|---|
| 4,151,008 A | 4/1979 | Kirkpatrick | 148/1.5 |
| 4,567,352 A * | 1/1986 | Mimura et al. | 219/405 |
| 5,219,786 A * | 6/1993 | Noguchi | 438/5 |
| 5,336,641 A | 8/1994 | Fair et al. | 437/248 |
| 5,523,262 A | 6/1996 | Fair et al. | 437/248 |
| 5,956,603 A | 9/1999 | Talwar et al. | 438/520 |
| 6,300,208 B1 | 10/2001 | Talwar et al. | 438/308 |
| 6,303,476 B1 | 10/2001 | Hawryluk et al. | 438/530 |
| 6,380,044 B1 | 4/2002 | Talwar et al. | 438/308 |
| 6,383,956 B1 | 5/2002 | Hawryluk et al. | 438/795 |
| 6,479,821 B1 | 11/2002 | Hawryluk et al. | 250/316.1 |
| 6,495,390 B1 | 12/2002 | Hawryluk et al. | 438/56 |
| 6,635,541 B1 | 10/2003 | Talwar et al. | 438/308 |
| 6,635,588 B1 | 10/2003 | Hawryluk et al. | 438/795 |
| 6,885,815 B1 * | 4/2005 | Kusuda et al. | 392/416 |

* cited by examiner

*Primary Examiner*—Joseph Pelham
(74) *Attorney, Agent, or Firm*—Allston L. Jones

(57) ABSTRACT

An apparatus and method for uniformizing the temperature distribution across a semiconductor wafer during radiation annealing of process regions formed in the wafer is disclosed. The method includes forming a silicon layer atop the upper surface of the wafer and irradiating the layer with one or more pulses of radiation having wavelengths that are substantially absorbed by the silicon layer. The silicon layer acts to uniformly absorb the one or more radiation pulses and then transfers the heat from the absorbed radiation to the process regions across the wafer.

26 Claims, 4 Drawing Sheets

Handbook of Optical Constants of Solids, Edited by Edward D. Palik, Academic Press, page 554.

SILICON LAYER FOR UNIFORMIZING TEMPERATURE DURING PHOTO-ANNEALING

BACKGROUND OF THE INVENTION

1. Field of the Invention

The present invention pertains to semiconductor processing, and in particular to a method of improving the temperature uniformity when photon-annealing a semiconductor substrate.

2. Description of the Prior art

In order to fabricate high-performance semiconductor devices such as integrated circuits (ICs), the manufacturing process typically includes an annealing process. The annealing process serves to activate dopants in the semiconductor wafer along the way to forming the final devices (e.g., transistors). One annealing technique involves irradiating the semiconductor wafer with short, intense pulses of radiation. This is referred to herein as "photo-annealing." The short duration of the annealing radiation pulses allows for the fabrication of transistors with very low sheet resistance and ultra-shallow junctions, which translates into optimal device performance.

When lasers are used to perform the annealing, the photo-annealing process is referred to as "laser thermal processing" (LTP), or alternatively "laser thermal annealing" (LTA). One method of LTA applied to semiconductor manufacturing involves using a short-pulsed laser to thermally anneal the source and drain of the transistor to activate the implanted dopants therein. Under the appropriate conditions, i.e. melting of the junction material followed by rapid solidification, it is possible to produce source and drain junctions with activated dopant levels that are above the solid solubility limit. This produces transistors with greater speeds and higher drive currents. This LTP technique is disclosed in U.S. Pat. No. 5,956,603, which patent is incorporated by reference herein.

Other techniques for photo-annealing semiconductor substrates involve the use of flash lamps to create the pulse of radiation. For example, U.S. Pat. No. 4,151,008, entitled, "Method Involving Pulsed Light Processing of Semiconductor Devices," discloses a method in which a pulsed laser or flash lamp produces a short duration pulse of light for thermal processing of selected regions of a semiconductor device. The light pulse is directed towards the semiconductor device and irradiates selected surface regions of the device to be processed. Energy from the absorbed light pulse momentarily elevates the temperature of the selected regions above threshold processing temperatures for rapid, effective annealing, sintering or other thermal processing. The characteristics of the light pulse are such that only those surface regions in the immediate vicinity of the flash, i.e. at the top of the substrate and within 100 microns of the edge of the field, are elevated to a high temperature. The remaining mass of the semiconductor device is not subjected to unnecessary or undesirable high temperature exposure and serves to quickly cool the heated area.

However, a shortcoming of this technique is that the dopant concentration cannot go beyond the solid solubility limit. Also, the technique suffers from temperature non-uniformities due to the different reflectivity properties of the transistor and related structures formed in and on the semiconductor substrate, prior to the annealing step.

Modern ICs contain a variety of device geometries and materials, and the accompanying structures formed in the semiconductor wafer have different reflectivities. To achieve uniform performance in each device, it is necessary that all devices be heated (annealed) to essentially the same temperature. This constrains the permissible variation in reflectivity of each device (e.g., transistor) in the circuit and constrains the spatial variations in the density of devices throughout the circuit. High-frequency spatial variations in reflectivity tend to be smoothed out by thermal conduction, but low frequency variations create similar variations in annealing temperature. For certain semiconductor processes, such as the process for activating dopants without melting the substrate (i.e., a non-melt process), the temperature of the surface of the semiconductor substrate must be kept very uniform ($<\pm 10°$ C.) and remain below the melting point of silicon (assuming the junction is not amorphized).

U.S. Pat. No. 6,635,588 (the '588 Patent) and U.S. Pat. No. 6,495,390 (the '390 Patent) describe respective techniques for controlling the amount of heat transferred to a process region of a workpiece (wafer) from exposure with a pulse of radiation. The '588 patent uses a thermally induced phase switch layer, and the '390 patent uses a thermally induced reflectivity layer. The phase switch layer is a film stack that includes an absorber layer and a layer of material that undergoes a phase transition. The absorber and phase transition layers are deposited atop a silicon wafer. The absorber layer absorbs radiation and converts the absorbed radiation into heat.

The phase transition layer can be deposited above or below the absorber layer and is chosen to have a phase transition temperature slightly above the desired maximum temperature of the underlying layers. The phase switch layer may include other layers, such as a thermal insulator layer and a layer to simplify stripping the phase switch layer once its function is completed. In some circumstances it is possible to combine some of the layers into a single layer serving multiple functions. The close proximity, of the phase switch layer and the device process region ensures that their temperatures are always very close. The high latent heat of the phase change holds the temperature of the phase switch layer constant once the phase transition temperature ($T_P$) is reached. Provided the radiation dose has reasonable limits so that some, but not all, of the phase transition material is converted to the second phase by the radiation pulse, then tight control of the maximum temperature seen by the process region may be expected.

The reflectivity switch layer of the '390 patent operates in a similar manner, except that the reflectivity layer transitions from a non-reflective state to a reflective state at a fixed reflectivity transition temperature. The reflective state strongly inhibits the further absorption of heat by the switch layer and consequently, the process region.

While the inventions of the '588 Patent and the '390 Patent are effective in controlling the maximum temperature seen by the process region during LTP, each requires the use of an absorbing layer and an active layer that undergoes a transition at some temperature. For the melt annealing process, there are material combinations that work very well. However, for non-melt annealing, there are few if any desirable materials for the phase transition layer and it is highly desirable to minimize the number of layers that have to be added and removed from the substrate for the annealing step.

Accordingly, it would be desirable to have simpler, more cost effective, methods of controlling the amount of heat delivered to a semiconductor wafer and to improve temperature uniformity during photo-annealing. In particular, it would be desirable to reduce the number of layers and restrict the layers to materials commonly employed in silicon semiconductor fabrication.

SUMMARY OF THE INVENTION

A first aspect of the invention is a method of annealing a silicon wafer having an upper surface and process regions formed therein. The method includes forming a silicon layer directly atop the wafer surface and covering the process regions. The method also includes irradiating the layer of silicon with one or more pulses of radiation. The radiation has a wavelength that is absorbed by the silicon layer. Also, each of the one or more radiation pulses has sufficient energy to raise the temperature of the wafer upper surface to a critical temperature corresponding to activating the process regions.

A second aspect of the invention is an apparatus for achieving a uniform temperature across the upper surface of a semiconductor wafer having process regions formed therein, during irradiation with annealing radiation. The apparatus includes a silicon layer formed directly upon the upper surface of the wafer and covering the process regions. The silicon layer absorbs a substantial amount of the annealing radiation and transmits heat from the absorbed radiation to the process regions in order to uniformly raise the temperature of the process regions to a critical temperature.

Figure 1:
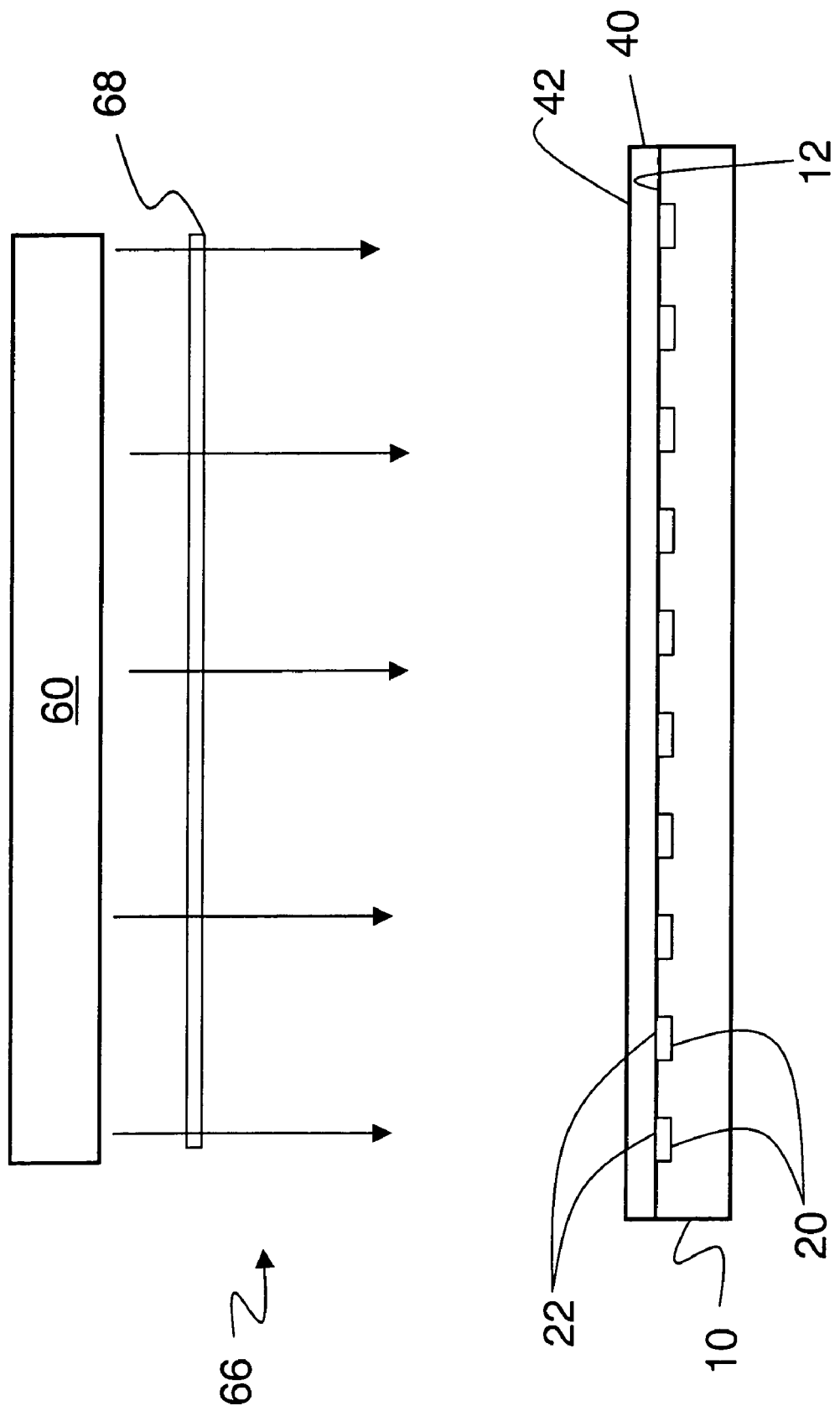
FIG. 1 is a cross-sectional schematic diagram of a semiconductor wafer having a region to be processed and a silicon layer formed directly atop the wafer surface to improve the temperature uniformity when heated by a pulse of radiation.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

Figure 2:
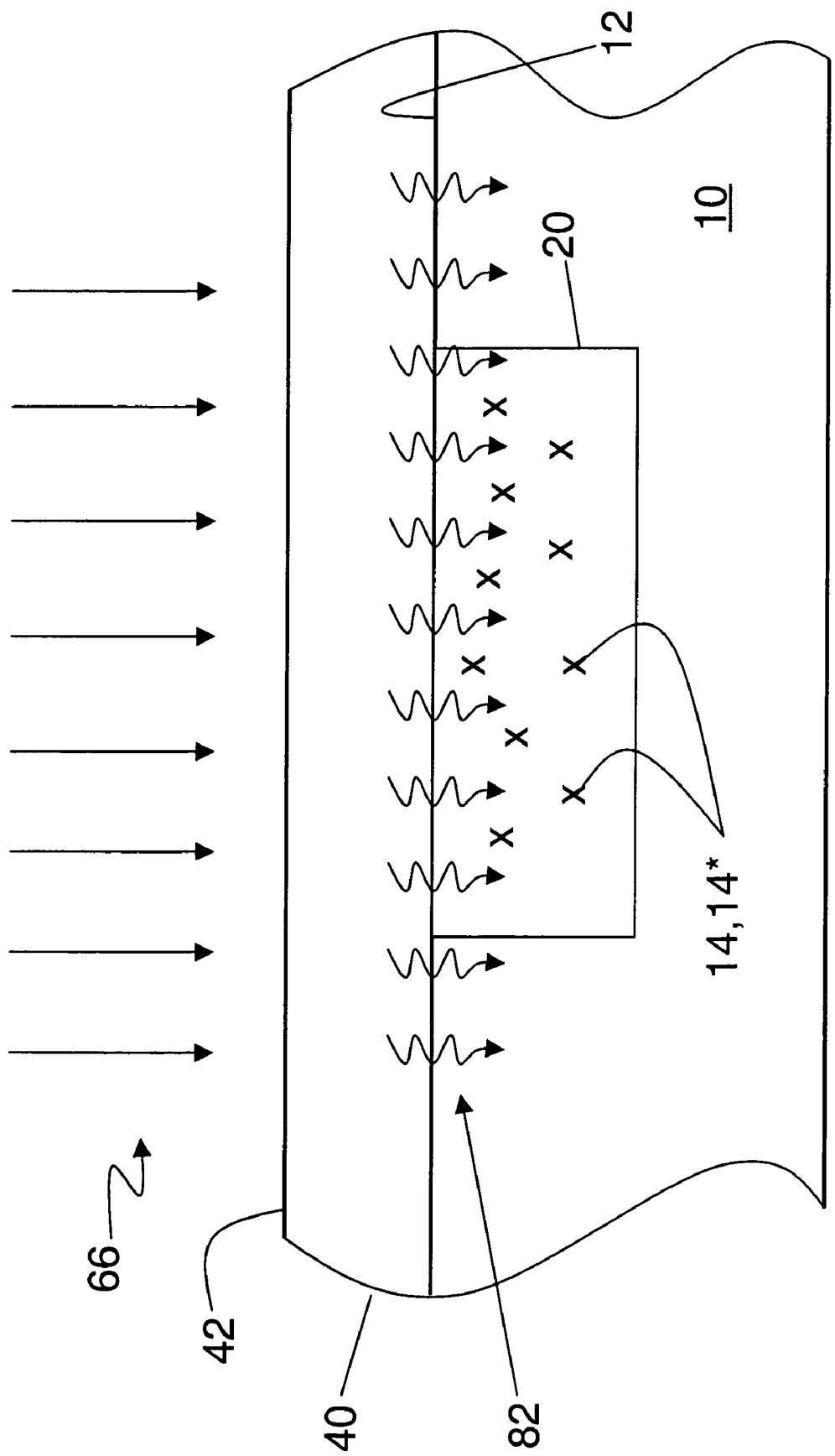
FIG. 2 is a close-up of the semiconductor wafer of FIG. 1 illustrating the absorption of radiation by the silicon layer and transfer of heat to the wafer and regions formed therein, in the process of activating dopants in the regions.

The basic concept of the apparatus and method of the present invention is illustrated in FIGS. 1 and 2 with regard to processing a semiconductor wafer as part of the process of manufacturing semiconductor devices such as transistors.

With reference to FIG. 1, there is shown a semiconductor (silicon) wafer ("wafer") 10 having an upper surface 12. Wafer 10 includes one or more process regions ("regions") 20 formed therein. The size of regions 20 is exaggerated in FIG. 1 for the sake of illustration. Regions 20 each have an upper surface 22 that, in an example embodiment, is defined by wafer surface 12. Generally speaking, regions 20 are formed at or near wafer upper surface 12.

In an example embodiment, regions 20 are formed by implantation, oxidation and polysilicon deposition. Typically, this results in films that include doped crystalline silicon junction regions, oxide trenches formed to isolate the junction regions and doped polysilicon layers to serve as electrical interconnects. It is worth noting that in a non-melt annealing process, amorphization of the junction regions is not mandatory as it is with the melt-process.

Dopants 14 (FIG. 2) implanted into the junctions in regions 20 may be activated by temperatures ranging from 800 to 1100° C., with annealing times ranging from hours to seconds. However very shallow, state-of-the-art junctions require annealing temperatures greater than 1100° C., e.g., in the range from about 1200° C. to about 1400° C. for times in the millisecond or shorter time frame. This short annealing time virtually stops the diffusion of dopants and assures the creation of very shallow junctions and very abrupt junction dopant profiles.

Regions 20 are to be annealed as part of the manufacturing process for forming a semiconductor device, as described below. For example, regions 20 may form the source and drain of a transistor, or may be suicide regions. In an example embodiment, regions 20 include silicon with implanted dopants 14 that are unactivated prior being annealed.

Formed directly atop wafer surface 12 and covering regions 20 is a silicon layer 40 having an upper surface 42. In an example embodiment, silicon layer 40 has a thickness of between about 300 Angstroms and about 20,000 Angstroms. It is desirable that the thickness of silicon layer 40 be sufficient to form a uniform, optically opaque layer that renders the underlying process layer invisible. The thickness required to achieve opacity depends, in turn, on the exposing wavelength spectrum. Undoped or lightly doped silicon at room temperature is relatively clear to radiation longer than 600 nm, however is an efficient absorber for wavelengths below 600 nm. Thus, if we restrict the silicon coating thickness to one micron or less, the usable wavelengths are shorter than 600 nm.

Figure 3:
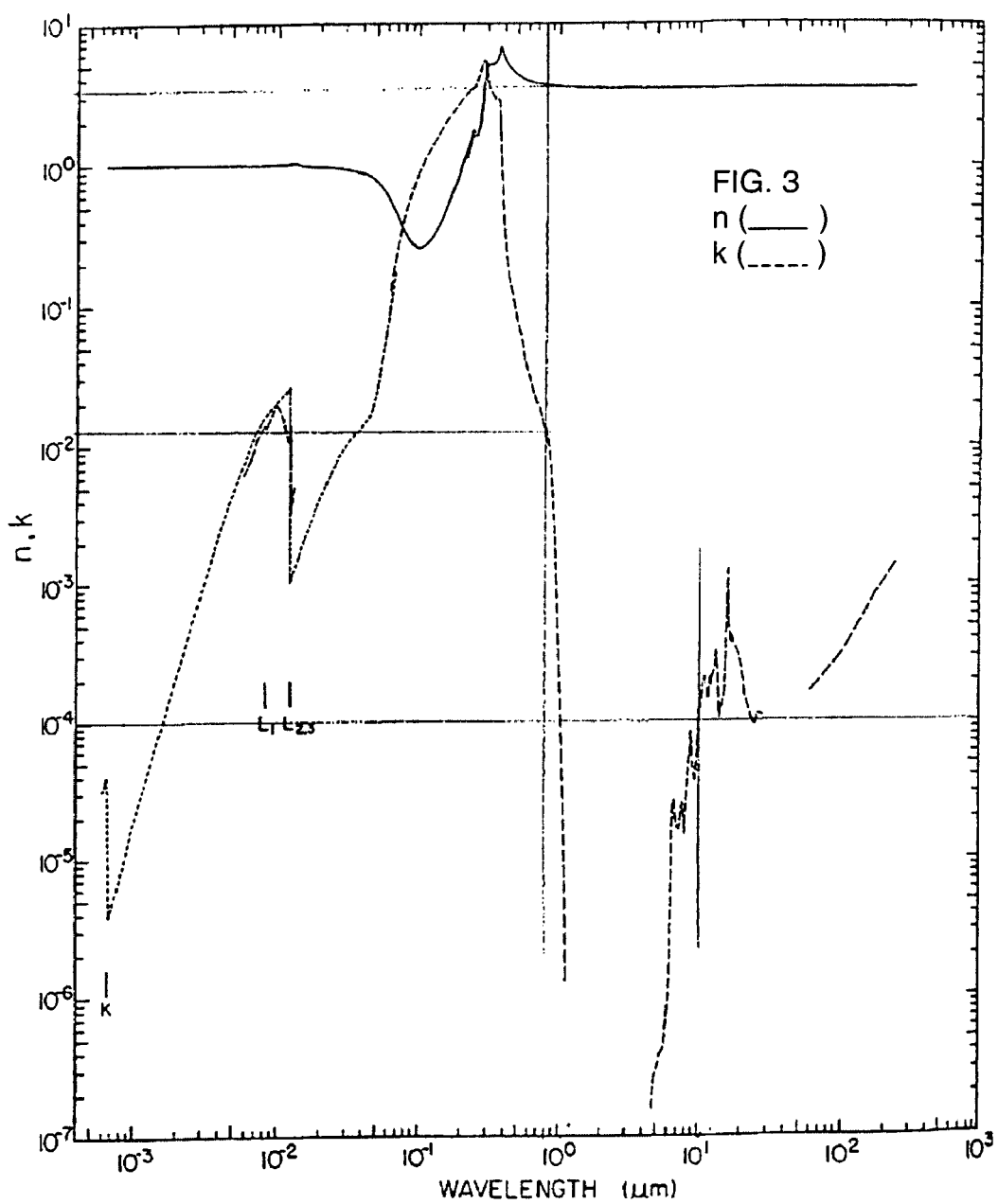
FIG. 3 is a plot of the real and imaginary parts of the index of refraction of silicon as a function of wavelength taken from the Handbook of Optical Constants of Solids, Edited by Edward D. Palik, Academic Press, page 554.

FIG. 3 is a plot of the real and imaginary parts of the index of refraction of silicon as a function of wavelength taken from the Handbook of Optical Constants of Solids, Edited by Edward D. Palik, Academic Press, page 554. FIG. 3 shows the variation in the n and k values (i.e., the real and imaginary values of the complex index of refraction) of silicon over a very wide range of wavelengths. The absorption coefficient $\mu$ can be calculated from the relationship:

$$\mu = 4\pi k/\lambda$$

where $\lambda$ is the wavelength.

The transmission T through a thickness $\delta$ is given by:

$$T = e^{-\mu\delta}$$

In an example embodiment, silicon layer 40 is formed using PVD, LPCVD or PECVD techniques. Silicon layer 40 can be deposited in amorphous or polycrystalline form. In an example embodiment, silicon layer 40 is formed directly atop wafer upper surface 12, however a thin oxide layer may be sandwiched between the process layer and the silicon layer to facilitate stripping the silicon absorber coating once its function is completed.

Where silicon layer 40 is amorphous silicon, a maximum temperature in the 1100° C.–1200° C. range will cause it to transform into a polysilicon coating. Thus, amorphous silicon coatings can be employed in a number of ways: they can be used at temperatures well below the amorphous to crystalline transformation temperature, or they can be used at annealing temperatures above the transition temperature where the amorphous layer will turn into polycrystalline silicon, and generate a temperature close to the silicon melting temperature of 1410° C.

Note that the melting temperature of silicon layer 40 is greater than the typical annealing temperatures used for regions 20. In the case where the desired annealing temperature is high (e.g., 1100° C.–1350° C.), directly deposited polycrystalline silicon can be used for silicon layer 40 to ensure that the amorphous to crystalline transformation process does not interfere with achieving the desired annealing temperature.

FIG. 1 further includes a radiation source 60 arranged to expose wafer 10 and silicon layer 40 with radiation 66 having a wavelength that is substantially (or completely) absorbed by silicon layer 40. In a preferred embodiment, radiation source 60 is adapted to emit radiation 66 having wavelengths shorter than 600 nm. In another example embodiment, a filter 68 is used to filter out or otherwise substantially attenuate wavelengths longer than 600 nm that are not substantially absorbed by silicon layer 40.

In an example embodiment, radiation source 60 is a flash lamp, such as a Xenon flash lamp. Also in an example embodiment, radiation filter 68 is arranged in front of radiation source 60, wherein the radiation filter is one that removes all or most of the portion of radiation 66 having a wavelength above 600 nm.

Figure 4:
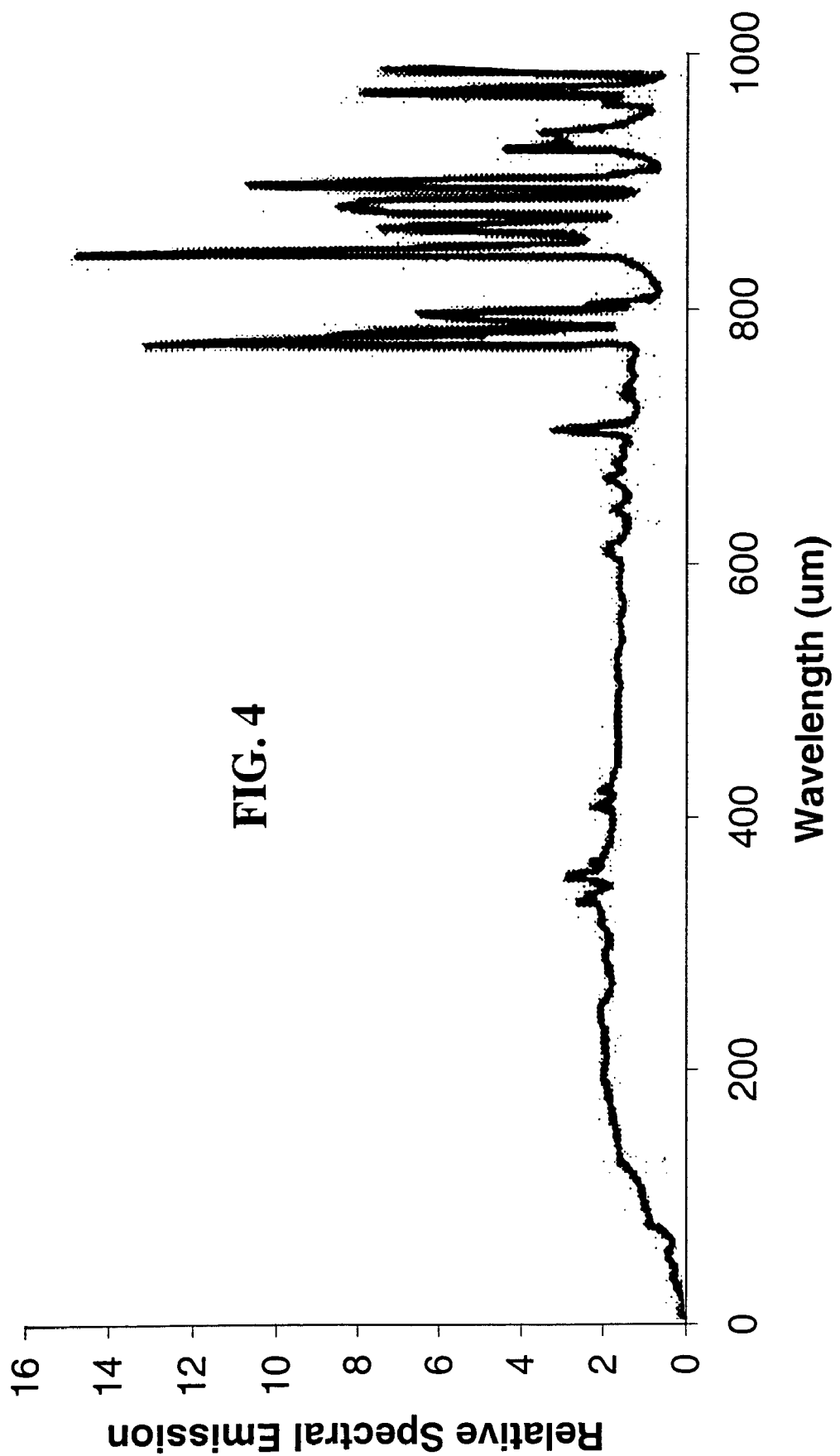
FIG. 4 is a plot of the spectral emission of a xenon flash lamp filled to a pressure of 390 torr at low electrical loading (100-microfarad capacitor charged to 500 V) as a function of wavelength.

FIG. 4 is a plot of the output of a Xenon flash lamp as a function of wavelength. As can be seen from FIG. 4, an advantage of using a flash lamp for radiation source 60 is that it has a relatively large spectral band with wavelengths shorter than 600 nm so that it generates a large amount of useful energy per pulse. As mentioned above, filter 68 can be used to filter out wavelengths longer than 600 nm. In an example embodiment of the present invention, the flash lamp delivers an amount of energy in the range between about 5 J/cm$^2$ and about 100 J/cm$^2$. A large flash lamp or flash lamp array is capable of irradiating a large area such as an entire semiconductor wafer, which nowadays has a diameter of 300 mm. In one of the preferred embodiments of the present invention, the entire wafer 10 is annealed in a single pulse of radiation from a flash lamp or flash lamp array. A radiation filter 68 can be adapted to filter out or attenuate unwanted wavelengths from the flash lamp.

In another preferred embodiment, radiation source 60 is a pulsed laser having a wavelength that is readily absorbed by silicon layer 40 and which is used to process only a portion of the substrate at any one time. In particular, radiation source 60 can be an excimer laser or a frequency-multiplied YAG laser.

The method of the present invention includes irradiating silicon layer 40 with one or more pulses of radiation 66 to photo-anneal wafer 10, or specifically the one or more regions 20 formed therein. Without silicon layer 40, wafer 10 will not be uniformly heated at or near upper surface 12 because of the different reflectivities of region surfaces 22, which include structures on the wafer such as interconnections, gates, etc., (not shown). Such structures are typically present on the wafer during processing and contribute to the reflectivity disparities over the wafer upper surface. The heating non-uniformity translates into annealing non-uniformity, which can result in non-functioning or sub-standard-functioning devices.

With reference also to FIG. 2, silicon layer 40 serves to absorb radiation 66 and convert it to heat 82. Heat 82 is then communicated by thermal diffusion to wafer 10 at upper surface 12 across the wafer. This heat serves to uniformly increase the temperature of wafer upper surface 12 and regions 20 across the wafer to a critical temperature, e.g., to a temperature where inactivated dopants 14 are transformed to activated dopants 14*. In an example embodiment, the critical temperature is between about 1100° C. and about 1410° C., and in another example embodiment is between 1200° C. and 1400° C.

Silicon layer 40 is uniformly heated by radiation 66 because, unlike wafer surface 12, silicon layer 40 has uniform reflectivity and absorbance.

Silicon layer 40 is able to serve as an absorbing layer for wafer 10 because it has the same coefficient of expansion as the wafer. Accordingly, neither the silicon layer 40 nor the wafer 10 will crack because there will be no differential stress between the two when heated up to the high annealing temperatures, e.g., 1350° C. or even up to near the melting point of silicon (1410° C.).

A goal of the present invention is to uniformly heat upper surface 12 of substrate 10 with either one radiation pulse 66 or multiple radiation pulses 66 to a critical temperature while remaining below a predetermined temperature. For a non-melt process (i.e., wherein the region 20 is not melted to achieve activation), the predetermined temperature is preferably the melt temperature of the region. However, in this case the predetermined temperature can be any temperature greater than the activation temperature of the region. For a melt process (i.e., wherein region 20 is melted to achieve activation), the predetermined temperature can be anywhere between the region melt temperature and the substrate and silicon layer melt temperatures (which typically will be essentially the same).

Once the irradiation process is complete, silicon layer 40 is removed using conventional etching techniques. In an example embodiment, a thin silicon dioxide coating is formed between the wafer and the silicon coating to serve as an etch stop.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A method of annealing a silicon wafer having an upper surface and process regions formed therein wherein the upper surface of the silicon wafer exhibits nonuniform reflectivities and the process regions, due to the nonuniform reflectivities of the upper surface, are prone to nonuniform heating upon direct exposure to annealing radiation, the method comprising the steps of:

a. forming a silicon layer having a uniform reflectivity and absorbency of annealing radiation atop the upper surface of the silicon wafer and covering the process regions therein, thereby rendering the process regions invisible to annealing radiation incident the silicon layer; and b. irradiating the silicon layer with one or more pulses of annealing radiation, the annealing radiation having a wavelength that is absorbed by the silicon layer, wherein each of the one or more radiation pulses has sufficient energy to cause the silicon layer to raise the temperature of the upper surface of the silicon wafer to a uniform critical temperature by thermal diffusion to activate the process regions formed in the silicon wafer without thermally inducing wafer cracking.

2. The method of claim 1 includes, preceding step b., the step of:
   c. generating the one or more pulses of annealing radiation with a flash lamp.

3. The method of claim 1 includes, preceding step b., the step of:
   c. generating the one or more pulses of annealing radiation with a pulsed laser.

4. The method of claim 1 includes, preceding step b., the steps of:
   c. generating one or more pulses of annealing radiation that includes wavelengths that will be absorbed by the silicon layer and wavelengths that will not be substantially absorbed by the silicon layer and
   d. filtering said one or more pulses of annealing radiation generated in step c. to remove most or all of said wavelengths that will not be substantially absorbed by said silicon layer.

5. The method of claim 1, wherein the critical temperature is in a range between about 1100° C. and about 1400° C.

6. The method of claim 1, wherein the silicon layer has a thickness in the range from 300 Angstroms to about 20,000 Angstroms.

7. The method of claim 1, wherein step a. forms the silicon layer as an amorphous silicon layer.

8. The method of claim 1, wherein step a. forms the silicon layer as a crystalline silicon layer.

9. The method of claim 1, wherein each of the one or more annealing radiation pulses have a duration less than 1 millisecond and the silicon layer has a thickness effective to absorb sufficient energy from each of the one or more annealing radiation pulses to raise the temperature of the upper surface of the wafer to a substantially uniform critical temperature near 1410° C. to activate the process regions.

10. The method of claim 9, wherein the critical temperature is effective to melt activate the process regions.

11. The method of claim 1, wherein the critical temperature is effective to activate the process regions without melting the process regions.

12. The method of claim 1, wherein a large area of a top surface of the silicon layer is radiated.

13. The method of claim 1, wherein in step b. at least a large area of a top surface of the silicon layer is irradiated.

14. The method of claim 1, wherein in step b. substantially the entire area of a top surface of the silicon layer is irradiated.

15. An annealing method comprising the steps of:
   a. providing a silicon wafer having an upper surface and doped regions formed therein wherein the upper surface of the silicon wafer exhibits nonuniform reflectivities and the dosed regions, due to the nonuniform reflectivities of the upper surface, are prone to nonuniform heating upon direct exposure to annealing radiation;
   b. forming a silicon layer having a uniform reflectivity and absorbency of annealing radiation atop the upper surface of the silicon wafer and covering the doped regions therein, thereby rendering the process regions invisible to annealing radiation incident the silicon layer; and
   c. irradiating the silicon layer with a single pulse of annealing radiation from a flash lamp, wherein the annealing radiation has wavelengths below 600 nm, and wherein the annealing radiation pulse imparts an amount of an energy between about 5 J/cm$^2$ and 100 J/cm$^2$ to a top surface of the silicon layer, without thermally inducing wafer cracking.

16. The method of claim 15, following step c., including the step of:
   d. removing the silicon layer.

17. The method of claim 15, the wherein the pulse has a duration less than 1 millisecond and the silicon layer has a thickness effective to absorb sufficient energy from the pulse to raise the temperature of the upper surface of the wafer to a substantially uniform critical temperature near 1410° C. to activate the process regions.

18. The method of claim 15, wherein in step c. at least a large area of a top surface of the silicon layer is irradiated.

19. The method of claim 15, wherein in step c. substantially the entire area of a top surface of the silicon layer is irradiated.

20. An apparatus to achieve a uniform temperature across an upper surface of a semiconductor wafer having process regions formed therein during irradiation of the upper surface with annealing radiation wherein the upper surface of the silicon wafer exhibits nonuniform reflectivities and the process regions, due to the nonuniform reflectivities of the upper surface, are prone to nonuniform heating upon direct exposure to annealing radiation, the apparatus comprising:
   a silicon layer having a uniform reflectivity and absorbency of annealing radiation formed upon the upper surface of the semiconductor wafer and covering the process regions therein, thereby rendering the process regions invisible to annealing radiation incident the silicon layer; and
   a radiation source disposed to deliver one or more pulses of annealing radiation to the silicon layer, the annealing radiation having a wavelength that will be absorbed by the silicon layer,
   wherein the silicon layer is disposed to absorb a substantial amount of the annealing radiation and to transmit heat from the absorbed radiation to the process regions in the semiconductor wafer to uniformly raise the temperature of the process regions to a uniform critical temperature by thermal diffusion, without inducing wafer cracking.

21. The apparatus of claim 20, wherein the silicon layer is amorphous.

22. The apparatus of claim 20, wherein the silicon layer is crystalline.

23. The apparatus of claim 20, wherein the silicon layer has a thickness in the range between about 300 Angstroms and about 20,000 Angstroms.

24. The apparatus of claim 20, wherein the one or more pulses have a duration less than 1 millisecond and the silicon layer has a thickness effective to absorb sufficient energy from the pulse to raise the temperature of the upper surface of the wafer to a substantially uniform critical temperature near 1410° C. to activate the process regions.

25. The apparatus of claim 20, wherein in said radiation source delivers annealing radiation to at least a large area of a top surface of the silicon layer.

26. The apparatus of claim 20, wherein in said radiation source delivers annealing radiation to substantially the entire area of a top surface of the silicon layer.

* * * * *